(12) United States Patent
Voorman et al.

(10) Patent No.: US 6,188,250 B1
(45) Date of Patent: Feb. 13, 2001

(54) PEAK DETECTION APPARATUS

(75) Inventors: Johannes O. Voorman, Eindhoven (NL); Joao N. V. L. Ramalho, Bieville-Beuville (FR); Mareel L. Lugthart, Eindhoven (NL)

(73) Assignee: U.S. Philips Corporation, New York, NY (US)

( * ) Notice: Under 35 U.S.C. 154(b), the term of this patent shall be extended for 0 days.

(21) Appl. No.: 09/229,821

(22) Filed: Jan. 13, 1999

(30) Foreign Application Priority Data

Jan. 15, 1998 (EP) .................................. 98200092

(51) Int. Cl.[7] .................................................. G01R 19/00

(52) U.S. Cl. ............................................... 327/58; 327/58

(58) Field of Search .................................. 327/58–62, 91

(56) References Cited

U.S. PATENT DOCUMENTS

| | | | |
|---|---|---|---|
| 4,736,163 | 4/1988 | Berkhout et al. | 328/162 |
| 5,357,150 | * 10/1994 | Jaquette | 327/58 |
| 5,428,307 | * 6/1995 | Dendinger | 327/62 |
| 5,469,090 | * 11/1995 | Narahara | 327/62 |

FOREIGN PATENT DOCUMENTS 97-2016596  3/1998 (EP) .

* cited by examiner

*Primary Examiner*—Toan Tran
(74) *Attorney, Agent, or Firm*—Bernard Franzblau

(57) ABSTRACT

An apparatus for detecting peaks of positive and negative polarity in an information signal. The apparatus comprises a first peak detector means for detecting the positive peaks and a second peak detector for detecting the negative peaks. The first peak detector means comprises a first capacitor, and has an attack time for charging the first capacitor (32) and a decay time for discharging the first capacitor, the attack time being shorter than the decay time. The first peak detector has an output for generating an output signal (42) having a first output signal value when the first peak detector is in a charging state for charging the first capacitor and having a second output value when the first peak detector is in a non-charging state. The first peak detector maintains the first capacitor charged at a first level ($V_t$) during time intervals that the information signal level is below said first level, said first level being larger than the zero signal level and the first peak detector is further in the charged state when the information signal level exceeds the charging level of the first capacitor. The second peak detector means comprises a second capacitor, and has an attack time for charging the second capacitor and a decay time for discharging the second capacitor, the attack time being shorter than the decay time. The second peak detector has an output (16) for generating an output signal having a third output signal value when the second peak detector is in a charging state for charging the second capacitor and having a fourth output value when the second peak detector is in a non-charging state. The second peak detector is adapted to maintain the second capacitor charged at a second level ($V_t$) during time intervals that the absolute value of said information signal level is below said second level, said second level being larger than the zero signal level. The second peak detector is further in the charged state when the absolute value of the information signal level exceeds the charging level of the second capacitor.

16 Claims, 3 Drawing Sheets

PEAK DETECTION APPARATUS

BACKGROUND OF THE INVENTION

This invention relates to an apparatus for detecting peaks of positive and negative polarity in an information signal, the apparatus comprising first peak detector means for detecting the positive peaks in the information signal and second peak detector means for detecting the negative peaks in the information signal.

An apparatus as defined above is known from U.S. Pat. No. 4,736,163 (PHN 11.112). The known apparatus is meant for detecting scratches in an audio signal so as to mute such scratches.

SUMMARY OF THE INVENTION

The invention aims at providing an apparatus for detecting peaks that is suitable for use in a reproduction apparatus for reproducing information from a hard disk. Therefore, in accordance with the invention, the apparatus for detecting peaks of a first polarity, such as a positive polarity, in an information signal, the comprises first peak detector means for detecting the peaks of said first polarity in the information signal, the first peak detector means comprising a first capacitor, the first peak detector means having an attack time for charging the first capacitor and a decay time for discharging the first capacitor, the attack time being shorter than the decay time. The first peak detector means has an output for generating an output signal having a first output signal value when the first peak detector means is in a charging state for charging the first capacitor and has a second output value when the first peak detector means is in a non-charging state. The first peak detector means is adapted to discharge the first capacitor to a first level and to further maintain the first capacitor charged at said first level during time intervals that the information signal level is below said first level, said first level being larger than the zero signal level and the first peak detector means further being in a charging state when the information signal level exceeds the charging level of the first capacitor. For further detecting peaks of a second polarity, such as a negative polarity, in said information signal, the apparatus further comprises second peak detector means for detecting the peaks of said second polarity in the information signal the second peak detector means comprising a second capacitor. The second peak detector means has an attack time for charging the second capacitor and a decay time for discharging the second capacitor. The attack time being smaller than the decay time, the second peak detector means has an output for generating an output signal having a third output signal value when the second peak detector means is in a charging state for charging the second capacitor and having a fourth output value when the second peak detector means is in a non-charging state, the second peak detector means being adapted to discharge the second capacitor to a second level and to further maintain the second capacitor charged at said second level during time intervals that the absolute value of said information signal level is below said second level, said second level being larger than the zero signal level and the second peak detector means further being in the charging state when the absolute value of said information signal level exceeds the charging level of the second capacitor.

The invention is based on the recognition to provide a peak detection apparatus that is robust, so that it does not react to small spurious peaks and further locates the exact position in time where the maximum peak value of the peaks occur. The robustness has been realized by maintaining the capacitor in the peak detector means charged at a certain threshold level which is greater than zero. Further, the change of the output signal of the peak detectors from the first to the second output value (in the case of the first detector means) is an indication of the location in time of the maximum of the peak.

BRIEF DESCRIPTION OF THE DRAWING

These and other aspects of the invention will be apparent from and described further in the following figure description in which.

DESCRIPTION OF THE PREFERRED EMBODIMENTS

Figure 1:
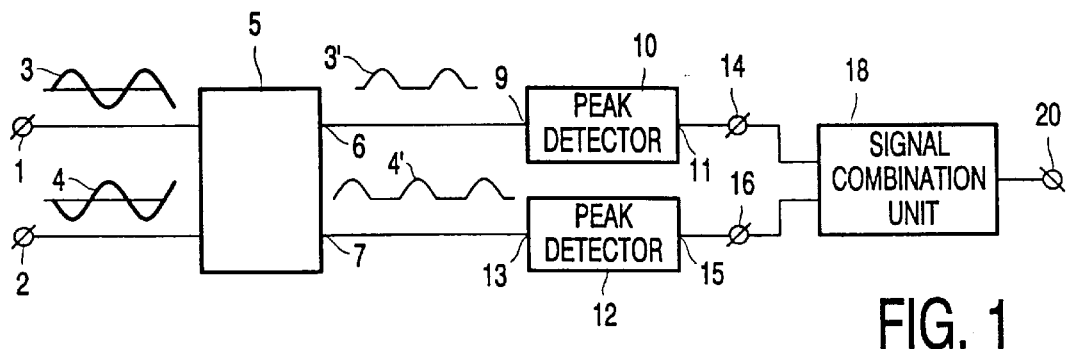
FIG. 1 shows an embodiment of the apparatus in accordance with the invention.

FIG. 1 shows a schematic embodiment of the apparatus in accordance with the invention. The apparatus comprises an input terminals 1, 2 for receiving an information signal which is in balanced form, as shown in FIG. 1 by the signals 3 and 4. This information signal can be the signal read from a hard disk. The input terminal 1, 2 is coupled to respective inputs of a rectifier unit 5. The rectifier unit 5 has outputs 6 and 7 coupled to respective inputs 9 and 13 of peak detectors 10 and 12, respectively. Outputs 11 and 15 of the peak detectors 10 and 12, respectively, are coupled to respective output terminals 14 and 16.

The rectifier unit 5 receives the signals 3 and 4 and generates in response thereto the signals 3' and 4', by passing only the positive periods of the signals 3 and 4. The signals 3' and 4' thus obtained are supplied to the peak detectors 10 and 12, respectively. The peak detector 10 thus detects the peaks of one polarity in the information signal, when assumed to be in non-balanced form and the peak detector 12 detects the peaks of the other polarity in the information signal, when assumed to be in non-balanced form.

Figure 2:
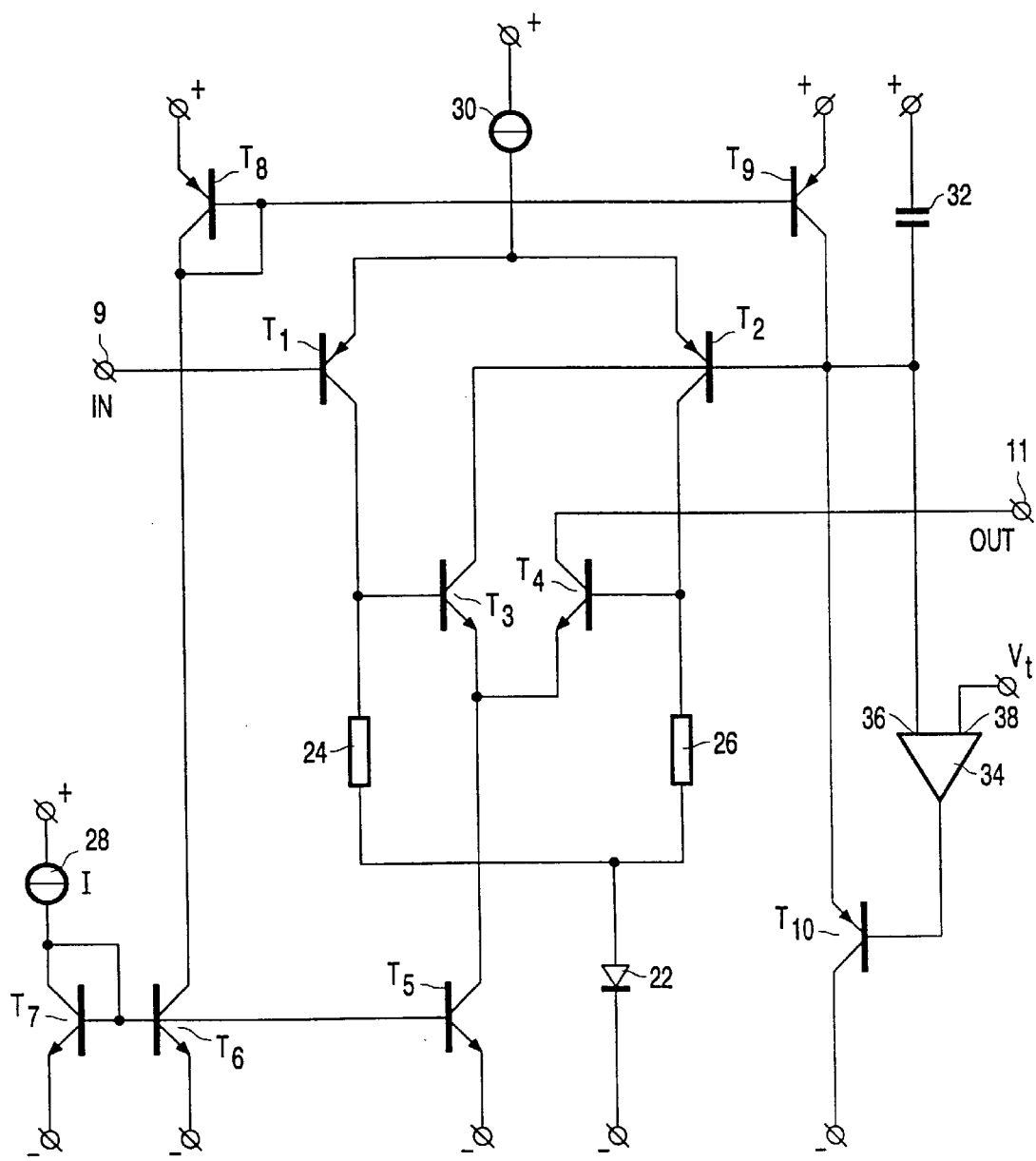
FIG. 2 shows a circuit diagram of a peak detector used in the apparatus.

FIG. 2 shows a circuit diagram of a peak detector, such as the peak detector 10. The input 9 is coupled to the control electrode (base) of a transistor $T_1$. A first main electrode (collector) of the transistor $T_1$ is coupled to a point of constant potential (−) via a series connection of a resistor 24 and a diode 22. A second transistor $T_2$ has its first main electrode (collector) coupled to said point of constant potential (−) via a series connection of a resistor 26 and said diode 22. The second main electrodes (emitters) of the transistors are interconnected and coupled to a second point of constant potential (+), via a current source 30. From now on, first main electrodes will be named 'collector', second main electrodes will be named 'emitter' and control electrodes will be named 'base'. The base of the transistor $T_2$ is coupled to the collector of a transistor $T_3$, whose base is coupled to the collector of the transistor $T_1$. The emitters of the transistor $T_3$ and a transistor $T_4$ are interconnected and coupled to the first point of constant potential (−) via a transistor $T_5$. The collector of the transistor $T_4$ is coupled to the output 11 of the peak detector. The base of the transistor $T_4$ is coupled to the collector of the transistor $T_2$. The base of the transistor $T_5$ is coupled to bases of transistors $T_6$ and $T_7$. Both transistors $T_6$ and $T_7$ have their emitters coupled to the first point of constant potential (−) The base and the collector of the transistor $T_7$ are interconnected and coupled to the second point of constant potential (+), via a current source 28. The collector of the transistor $T_6$ is coupled to the second point of constant potential (+), via a transistor $T_8$. The base and the collector of the transistor $T_8$ are interconnected and is coupled to the base of a transistor $T_9$. The transistor $T_9$ has its emitter coupled to the second point of constant potential (+). Its collector is coupled to the base of the transistor $T_2$ and to the emitter of a transistor $T_{10}$. The collector of the transistor $T_{10}$ is coupled to the first point of constant potential (−) and the base of the transistor T10 is coupled to the output of a comparator 34. An input 36 of the comparator 34 is coupled to the collector of the transistor $T_9$ as well as to a terminal of a capacitor 32. The other input 38 of the comparator 34 is coupled to a terminal for receiving a threshold voltage $V_r$. The other terminal of the capacitor 32 is coupled to the second point of constant potential (+).

The operation of the peak detector of FIG. 2 will be explained hereafter. Charging of the capacitor 32 is realized by means of a charging current that runs via the transistors $T_3$ and $T_5$ and discharging of the capacitor 32 is realized by a discharging current that flows via the transistors $T_9$, $T_8$ and $T_6$. The transistors $T_5$ and $T_6$ are the current sources for the charging and discharging currents, respectively. The transistors $T_5$ and $T_6$ are set to such current amplitudes that the charging current realized by the transistor $T_5$ is n times higher than the discharge current realized by the transistor $T_6$.n can have a value of 5, as an example. Therefore, the charging current is higher than the discharging current, so that the attack time for charging the capacitor 32 is shorter than the decay time for discharging the capacitor 32.

The input 9 of the peak detector 10 receives the signal 3', after signal inversion (not shown). When the (absolute value of the) input signal is larger than the charging level of the capacitor 32, the peak detector attacks and charges the capacitor 32 by switching the transistor $T_3$ into a conductive state, so that the charging current is supplied to the capacitor 32. When in the non-attack situation, the transistor $T_3$ is cut off and the charging current is supplied via the transistor $T_4$ to the output 11.

When the (absolute value of the) input signal is below the charging level of the capacitor 32, the capacitor 32 discharges until the charging level of the capacitor 32 reaches the charging level $V_r$, which equals the threshold level, applied to the input 38. Now, the transistor $T_{10}$ becomes conductive so that the discharging current is diverted via the transistor $T_{10}$. As a result, the charging level of the capacitor 32 is maintained at the value $V_r$.

Figure 3:
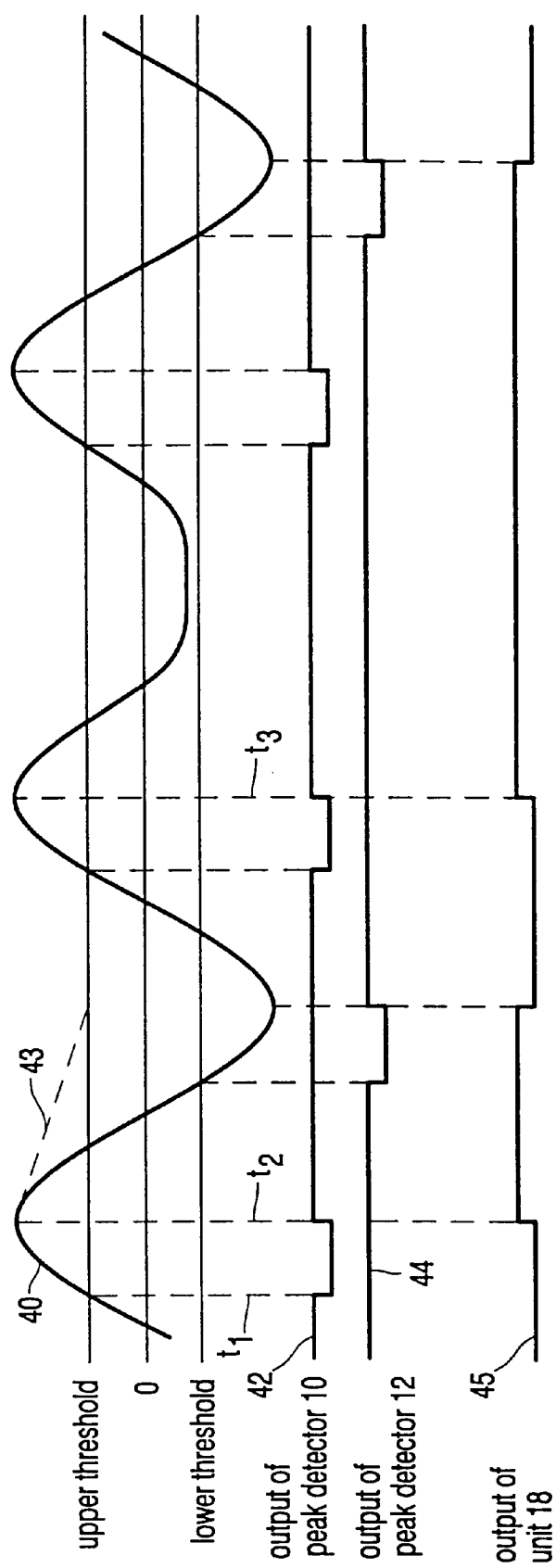
FIG. 3 shows some signals as a function of time, that occur in the apparatus of FIG. 1.

The functioning of the peak detectors will now be further explained with reference to FIG. 3. FIG. 3 shows an information signal 40 comprising pulses of positive and negative polarity. When the signal supplied to a peak detector becomes higher than $V_r$, that is at the time instant $t_1$ in FIG. 3, the peak detector attacks and starts charging the capacitor 32. As a result of this, the signal level (a current) at the output 11 drops to zero. At the peak of the signal, that is at the time instant $t_2$, charging stops and the output signal at the output 11 is switched on (that is: a current appears at the output 11) again.

The attack time constant of the peak detector is preferably 'that short' that the charging level of the capacitor 32 nearly instantaneously follows the signal level of the input signal. The decay time constant is 'much' longer, so that the charging level of the capacitor 32 slowly decays, as indicated in FIG. 3 along the line 43. The line 42 in FIG. 3 shows the output signal of the peak detector 10 in response to the information signal 40 and the line 44 shows the output signal of the peak detector 12 in response to the information signal 40.

The apparatus as described thus far is very robust, in that it is immune to spurious peaks of level lower than the threshold level $V_r$. Further, the apparatus can be used in an arrangement for pulse detection, such as for detection of so-called dibits present in the servo patterns in the tracks on a hard disk. The dibits are in the form of one positive peak, followed by one negative peak. To detect those dibits, the signal combination unit 18 is available. The combination unit 18 has two inputs coupled to the terminals 14 and 16 and an output coupled to the terminal 20.The combination unit 18 could be in the form of a flip flop, having a set input coupled to the terminal 14 and a reset input coupled to the terminal 16. The output signal of the flip flop 18 is switched from 'low' to 'high', when a rising edge occurs in the output signal of the peak detector 10. The output signal is switched from 'high' to 'low' upon the occurrence of a rising edge in the output signal of the peak detector 12. This results in the output signal 45 given in FIG. 3.

When gating both output signals 42 and 44 with the signal 45, it can be established that a negative peak was missed in the time interval between the second and third peak in the signal 42, as can be seen in FIG. 3. This information can be used to correctly identify the two peaks of a dibit.

The signal combination unit 18 could include further circuitry so as to generate an unsafe indication signal in response to the output signals of the two peak detectors. The signal combination unit 18 could generate the unsafe detection signal upon a non alternating detection of positive and negative peaks in the information signal. In another elaboration of the signal combination unit 18, the signal combination unit 18 is adapted to generate the unsafe detection signal upon the time interval between two consecutive peaks exceeding a predetermined period of time. More specifically, the signal combination unit 18 could generate the unsafe detection signal upon the time interval between two consecutive peaks of the same polarity exceeding said predetermined period of time. This period of time could be chosen equal to $t_3-t_2$, see FIG. 3.

The apparatus described above with reference to the FIGS. 1, 2 and 3 can preferably be used in combination with an automatic gain control circuit, as described in earlier filed European patent application no. 97201659.6, which corresponds to U.S. Pat. No. 6,137,647, issued Oct. 24, 2000.

Figure 4:
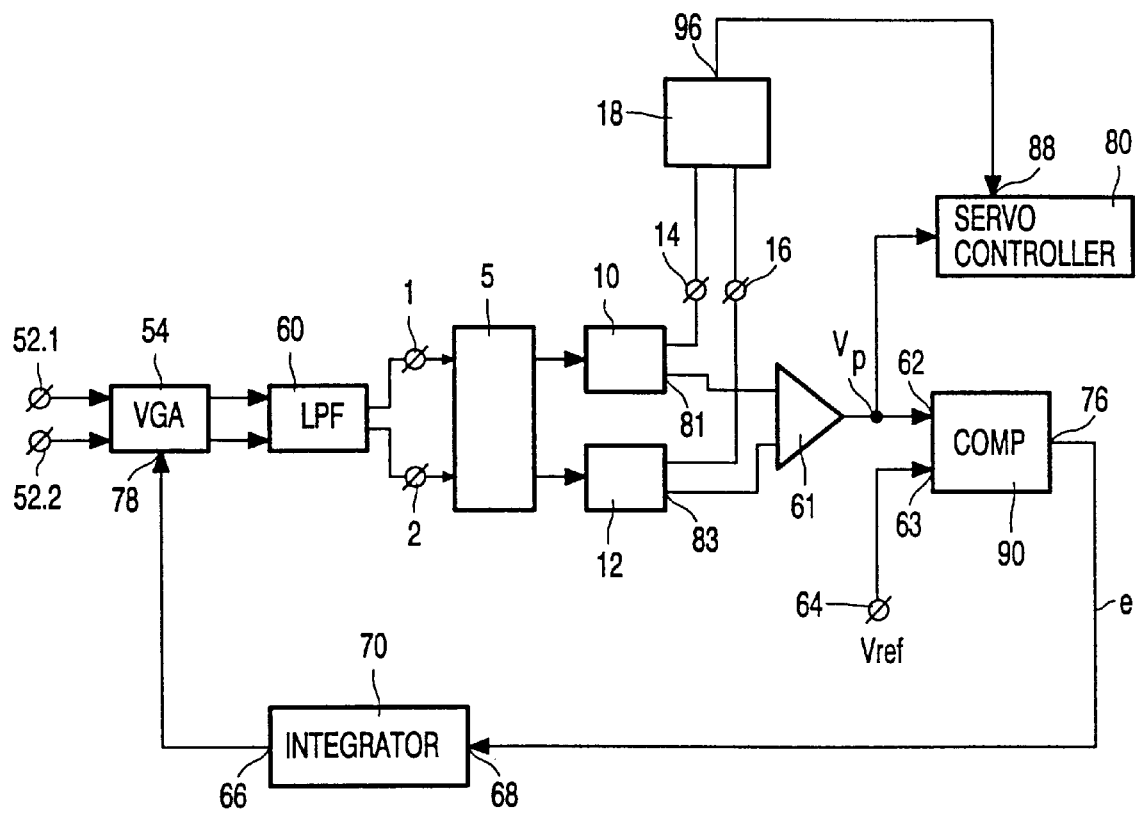
FIG. 4 shows an embodiment of an automatic gain control circuit provided with the peak detection apparatus, and FIG. 5 a servo pattern, as present in a track on a hard disk.

FIG. 4 shows an embodiment of the automatic gain control circuit, which is provided with the apparatus described above. The AGC circuit has an input terminal 52 for receiving an input signal. This input signal can be the signal read from a hard disk and can again be in the form of a balanced signal. The input terminal 52.1,52.2 for receiving the balanced signal is coupled to an input of a variable gain amplifier 54. An output of the amplifier 54 is coupled, via a lowpass filter 60, which could be considered to be included in the amplifier 54, to the input 1,2 of the peak detector apparatus as described above. The peak detector apparatus has two further outputs 81 and 83 at which output signals are available that are representative of the signal levels present on the capacitors in the two peak detectors 10 and 12, respectively. Those outputs 81 and 83 of the peak detector apparatus are coupled to inputs of an adder unit 61. The output of the adder unit 61 is coupled to an input 62 of a comparator unit 90, which has a second input 63 coupled to a terminal 64 at which a reference value Vref is available for supply to the input 63. An output 76 of the comparator unit 90 is coupled to an input 68 of an integrator unit 70. An output 66 of the integrator unit 70 is coupled to a control signal input 78 of the variable gain amplifier 54. The variable gain amplifier 54 amplifies the signal applied to its input, in response to the gain control signal applied to its control signal input 78, and supplies an amplified signal to its output. The peak detector apparatus detects peaks in said amplified signal, and, in response to the output signals present at the outputs 81 and 83 of the peak detector apparatus, the adder unit 61 generates an output signal $V_P$ at its output which is representative of the peak-to-peak value of the signal applied to the input 1,2 of the peak detector apparatus.

The comparator unit 90 compares the output signal $V_P$ with said reference value $V_{ref}$ so as to derive an error signal e therefrom. More specifically, the comparator unit 90 subtracts $V_{ref}$ from $V_P$ so as to obtain said error signal e. The error signal e is integrated in the integrator unit 70. This results in a control signal applied to the control signal input 78 so as to control the gain the variable gain amplifier 54. The gain in the amplifier 54 is controlled in such a way that the error signal e is controlled towards a small value (zero).

An extensive description of the functioning of the AGC circuit can be found in the above mentioned European patent application, which is considered to be incorporated herein by reference. The AGC circuit of FIG. 4 can preferably be used in a demodulator circuit for demodulating the servo patterns prerecorded on a hard disk.

Figure 5:
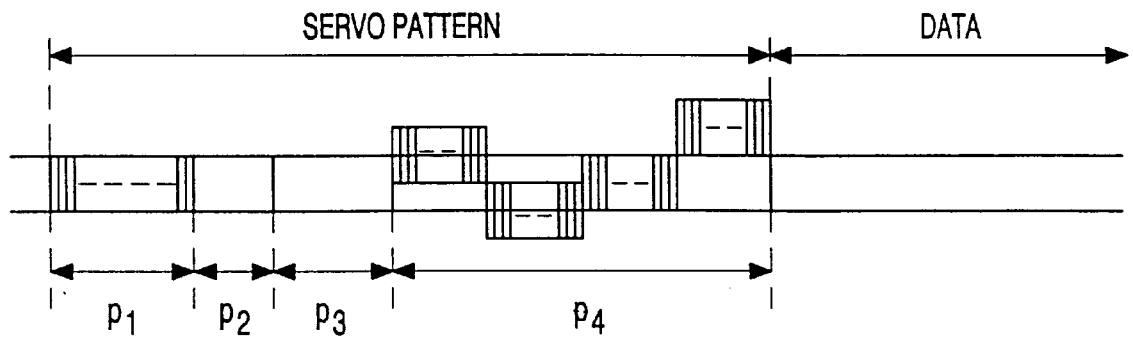

FIG. 5 shows schematically the contents of a servo pattern. The servo pattern in a track on the hard disk comprises an AGC portion, denoted $P_1$, used for setting the time constants in the automatic gain control circuit, a timing reference portion $P_2$, for bringing a data detection circuit (not shown) into correct timing relationship with the information read from the track, a Gray code portion $P_3$, which identifies the tracks by an increasing number, when going from the centre towards the edge of the disk, and a servo burst portion $P_4$, which is used for enabling a track servo control, so as to correctly position a read head on the track in a direction transverse to the track. The AGC portion $P_1$ comprises a burst of a plurality of eg. for example 40 dibits. The timing reference portion $P_2$ is, eg. for example 8 dibits long, but comprise a timing mark comprised of one or more dibits. The Gray code portion $P_3$ is eg. for example 13 dibits long and the servo burst portion $P_4$ comprises a plurality of servo bursts of a number of eg. for example 11 dibits each.

The detection of the amplitudes of the servo bursts can be realized by a servo controller 80, shown schematically in FIG. 4. The amplitudes of the various bursts in the portion $P_4$ are an indication of how far the read head (not shown) is positioned off track. When the head is mispositioned, this head position can be corrected accordingly.

Burst amplitude detection can be carried out safely, provided that the AGC has acquired accurately. When the resulting VGA gain is too low, the timing mark may be mis-detected (by missing the positive or negative peak) or it may not be detected at all. When the VGA gain is too high, some noise peak might be detected as a timing mark. This type of mis-detection could lead to writing the data at wrong positions on the track, possibly overwriting a part of the servo pattern.

The peak detection apparatus in accordance with the invention could be used to identify a correct VGA gain, namely by using the unsafe indication signal. This unsafe detection signal, present at the signal line 96 in FIG. 4, can be supplied to the servo controller 80.

In response to the unsafe detection signal, the servo controller 80 could correct the servo control signal, so that unsafe situations, because of missing peaks or added peaks, will not negatively influence the servo control signal for controlling the position of the head on a track.

Although the invention has been described with reference to preferred embodiments thereof, it is to be understood that these are not limitative examples. Thus, various modifications may become apparent to those skilled in the art, without departing from the scope of the invention, as defined by the claims. It should be noted that, where the invention has been described with reference to an apparatus that processes a balanced signal, it requires no inventive activity to convert the apparatus described into an apparatus for processing a non-balanced signal.

Further, the invention lies in each and every novel feature and combination of features.

What is claimed is:

1. Apparatus for detecting peaks of a first polarity in an information signal, the apparatus comprising: first peak detector means for detecting the peaks of said first polarity in the information signal, the first peak detector means comprising a first capacitor, the first peak detector means having means for charging the first capacitor with an attack time and a means for discharging the first capacitor with a decay time, the attack time being smaller than the decay time, the first peak detector means having an output for generating an output signal having a first output signal value when the first peak detector means is in a charging state for charging said first capacitor and having a second output value when the first peak detector means is in a non-charging state, the first peak detector means including means for discharging the first capacitor to a first level and to further maintain the first capacitor charged at said first level during time intervals that the information signal level is below said first level, said first level being greater than the zero signal levels and means for holding the first peak detector means in a charging state when the information signal level exceeds the charging level of the first capacitor.

2. Apparatus as claimed in claim 1, for further detecting peaks of a second polarity in said information signal, the apparatus further comprising second peak detector means for detecting the peaks of said second polarity in the information signal, the second peak detector means comprising a second capacitor, the second peak detector means having means for charging the second capacitor with an attack time and means for discharging the second capacitor with a decay time, the attack time being smaller than the decay time, the second peak detector means having an output for generating an output signal having a third output signal value when the second peak detector means is in a charging state for charging said second capacitor and having a fourth output value when the second peak detector means is in a non-charging state, the second peak detector means including means for discharging the second capacitor to a second level and to further maintain the second capacitor charged at said second level during time intervals that the absolute value of said information signal level is below said second level, said second level being greater than the zero signal level, and means for holding the second peak detector means in the charging state when the absolute value of said information signal level exceeds the charging level of the second capacitor.

3. Apparatus as claimed in claim 2, wherein said first level is equal to said second level.

4. Apparatus as claimed in claim 2, which further comprises signal combination means, having a first input for receiving the output signal of the first peak detector means and a second input for receiving the output signal of the second peak detector means and an output for supplying an unsafe indication signal in response to said output signals.

5. Apparatus as claimed in claim 4, wherein the signal combination means includes means for generating the unsafe indication signal upon a non alternating detection of peaks of the first and the second polarity in the information signal.

6. Apparatus as claimed in claim 4, wherein the signal combination means includes means for generating the unsafe indication dependent upon the time interval between two consecutive peaks exceeding a predetermined period of time.

7. Apparatus as claimed in claim 6, wherein the signal combination means is adapted to generate the unsafe indication upon the time interval between two consecutive peaks of the same polarity exceeding said predetermined period of time.

8. The apparatus as claimed in claim 1 wherein said first polarity is a positive polarity.

9. The apparatus as claimed in claim 2 wherein said second polarity is a negative polarity.

10. The apparatus as claimed in claim 3 further comprising:
signal combination means having a first input for receiving the output signal of the first peak detector means and a second input for receiving the output signal of the second peak detector means, and an output for supplying an unsafe indication signal in response to said output signals.

11. The apparatus as claimed in claim 1 further comprising:
a comparator having a first input that receives a threshold voltage and a second input that is coupled to said first capacitor,
a switching transistor having a control electrode coupled to an output of the comparator and a first main electrode coupled to said first capacitor, said comparator driving the switching transistor into conduction when the first capacitor is discharged to a charging level equal to said threshold voltage whereupon the first capacitor discharge current flows through the switching transistor thereby to hold the charging level of the first capacitor at the level of the threshold voltage.

12. The apparatus as claimed in claim 11 further comprising:
a first transistor connected in a charge path of the first capacitor and a second transistor connected in a discharge path of the first capacitor, wherein the first and second transistors are adjusted so that the first capacitor charge current in the first transistor is higher than the first capacitor discharge current in the second transistor.

13. An automatic gain control circuit comprising:
a variable gain amplifier having input means for receiving an input signal, and output means coupled to respective input means of first and second peak detector means, wherein
the first peak detector means detect peaks of a first polarity in the input signal and comprises;
a first capacitor, the first peak detector means having means for charging the first capacitor with an attack time and a means for discharging the first capacitor with a decay time, the attack time being smaller than the decay time, the first peak detector means having an output for generating an output signal having a first output signal value when the first peak detector means is in a charging state for charging said first capacitor and having a second output value when the first peak detector means is in a non-charging state, the first peak detector means including means for discharging the first capacitor to a first level and to further maintain the first capacitor charged at said first level during time intervals that the information signal level is below said first level, said first level being greater than the zero signal level, and means for holding the first peak detector means in a charging state when the information signal level exceeds the charging level of the first capacitor, wherein
the second peak detector means detect peaks of a second polarity in the signal and comprises;
a second capacitor, the second peak detector means having means for charging the second capacitor with an attack time and means for discharging the second capacitor with a decay time, the attack time being smaller than the decay time, the second peak detector means having an output for generating an output signal having a third output signal value when the second peak detector means is in a charging state for charging said second capacitor and having a fourth output value when the second peak detector means is in a non-charging state, the second peak detector means including means for discharging the second capacitor to a second level and to further maintain the second capacitor charged at said second level during time intervals that the absolute value of said information signal level is below said second level, said second level being greater than the zero signal level, and means for holding the second peak detector means in the charging state when the absolute value of said information signal level exceeds the charging level of the second capacitor, the automatic gain control circuit further comprising;
an adder unit having input means coupled to respective outputs of the first and second peak detector means,
a comparator having a first input coupled to an output of the adder unit and a second input coupled to a point of reference voltage, and
an integrator having an input coupled to an output of the comparator and an output coupled to a gain control input of the variable gain amplifier.

14. The automatic gain control circuit as claimed in claim 13 further comprising a low pass filter coupled between the output means of the variable gain amplifier and the respective input means of the first and second peak detector means.

15. The automatic gain control circuit as claimed in claim 14 further comprising a rectifier unit coupled in cascade with the low pass filter between the output means of the variable gain amplifier and the respective input means of the first and second peak detector means.

16. The automatic gain control circuit as claimed in claim 13 further comprising:
signal combination means having a first input for receiving the output signal of the first peak detector means and a second input for receiving the output signal of the second peak detector means, and an output coupled to a first input of a servo controller, and
means coupling a second input of the servo controller to the output of the adder unit.

* * * * *